(12) United States Patent
Kim et al.

(10) Patent No.: US 6,337,223 B1
(45) Date of Patent: Jan. 8, 2002

(54) SEMICONDUCTOR OPTICAL DEVICE AND METHOD FOR FABRICATING THE SAME

(75) Inventors: Wook Kim, Seoul; Tae Kyung Yoo, Kyonggi-do, both of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/351,439

(22) Filed: Jul. 12, 1999

(30) Foreign Application Priority Data

Jul. 14, 1998 (KR) .......................................... 98-28370

(51) Int. Cl.⁷ ............................................... H01L 21/20
(52) U.S. Cl. .......................................... 438/42; 438/44
(58) Field of Search .............................. 438/22, 24, 42, 438/43, 44, 38, 39, 40, 41, 46

(56) References Cited

U.S. PATENT DOCUMENTS

| | | | |
|---|---|---|---|
| 4,575,919 A | * 3/1986 | Legan et al. | |
| 4,716,129 A | * 12/1987 | Taneya et al. | ................. 438/43 |
| 5,561,080 A | * 10/1996 | Ishibashi et al. | ............... 438/44 |
| 5,827,754 A | * 10/1998 | Min et al. | ..................... 438/40 |
| 5,872,022 A | * 2/1999 | Motoda et al. | |
| 5,904,492 A | * 3/1999 | Min et al. | ..................... 438/42 |
| 5,982,798 A | * 11/1999 | Okuda | .......................... 372/46 |

* cited by examiner

*Primary Examiner*—Savitri Mulpuri
(74) *Attorney, Agent, or Firm*—Fleshner & Kim, LLP

(57) ABSTRACT

A semiconductor optical device and a method for fabricating the same. The semiconductor optical device comprises a substrate, a semiconductor electrode layer of a first conductive type formed on the substrate and having a groove formed to a desired depth therein, a semiconductor layer of the first conductive type formed from side walls of the groove up to a part of the semiconductor electrode layer of the first conductive type on the periphery of the groove, a cladding layer of the first conductive type, an active layer of the first conductive type, a cladding layer of a second conductive type and a semiconductor electrode layer of the second conductive type sequentially formed on the semiconductor layer of the first conductive type, and electrodes of the first and second conductive types formed respectively on the semiconductor electrode layers of the first and second conductive types.

6 Claims, 9 Drawing Sheets

SEMICONDUCTOR OPTICAL DEVICE AND METHOD FOR FABRICATING THE SAME

BACKGROUND OF THE INVENTION

1. Field of the Invention

The present invention relates to a semiconductor optical device which can be used as a pick-up for an optical disk and a method for fabricating the optical device.

2. Description of the Prior Art

A semiconductor laser diode of nitride (GaN or $In_{x}Ga_{1-x}N(0<x\leq1)$), recently proposed, has a thin film structure comprising an n-type GaN layer, n-type cladding layer, active layer of a multilayered structure (a structure of single or plural quantum wells), p-type cladding layer and p-type GaN layer which are sequentially grown on a substrate of sapphire. After the laser diode film is grown, a dry etching process is performed to etch regions of a surface of the grown laser diode film in which n-type and p-type electrodes, necessary to the operation of the laser diode, are to be formed. Then, the electrodes are formed in the etched surface regions, thereby completing the semiconductor laser diode structure.

At this time, the dry etching process or a cleaving process is finally used for the formation of an optical cavity mirror which is an important factor for laser oscillation.

In a conventional process of fabricating a GaAs-based semiconductor laser diode, as shown in FIG. 1, a thin film of the same material as that of a substrate is grown on the substrate, thereby making it easy to form an optical cavity mirror using a cleaved region in a crystal structure. However, in a nitride semiconductor laser diode where a thin film of nitride is grown on a (0001) sapphire substrate, as shown in FIG. 2, the sapphire substrate and nitride film are different in lattice constant and, further, crystal orientations thereof are swerved 30 degrees on the basis of a c-axis from each other. These make it very difficult to form an optical cavity mirror using a common, cleaved region of the sapphire substrate and nitride film. For this reason, it is known that the dry etching process is mainly used for the formation of an optical cavity mirror.

On the other hand, a normal metal organic chemical vapor deposition (MOCVD) method may be used for the growth of a nitride semiconductor film. In this case, the grown nitride film has a threading dislocation density in a range of $10^{8}\sim10^{9}cm^{-2}$, which is much higher than that of a conventional GaAs film.

In the case where a silicon oxide pattern-based epitaxial lateral overgrowth (ELOG) method is used to grow a nitride film, it is known that the grown nitride film has a threading dislocation density of near zero. In practice, it has been reported that the operation life time of a laser diode which is fabricated from a semiconductor film structure grown by ELOG method is lengthened from the existing several hundred hours up to several thousands to a myriad of hours.

However, in the fabricated semiconductor laser diode of the above report, an optical cavity mirror is formed in a dry etching manner, which must be followed by complex processes such as a photolithography after the formation of electrodes. The operation of the laser diode may be damaged due to contamination in those processes or a physical and chemical shock to the mirror formed during the dry etching. Such damage is not negligible.

In a ridged semiconductor laser diode employing a ridged structure for the focusing of current, the dry etching process is required once more for the formation of a ridge.

As a result, the development of a new process is required which is capable of excluding a dry etching process being liable to give a physical and chemical shock to an optical cavity mirror in a fabricating process of a GaN semiconductor laser diode and simplifying complex processes following the formation of the mirror, thereby increasing the reliability of the semiconductor laser device.

A conventional GaN semiconductor laser diode and a method for fabricating the same have the following disadvantages.

A dry etching process and the associated processes are performed to form an optical cavity mirror and a ridge, thereby making the entire processing very complex.

Further, the above-mentioned processes are liable to give a physical and chemical shock to a surface of the optical cavity mirror, resulting in a degradation in the reliability of the device.

SUMMARY OF THE INVENTION

Therefore, the present invention has been made in view of the above problems, and it is an object of the present invention to provide a semiconductor optical device and a method for fabricating the same, in which a dry etching process conventionally used for the formation of an optical cavity mirror and a ridge is omitted, thereby simplifying a fabricating process of the device and increasing the reliability of the device.

In accordance with one aspect of the present invention, there is provided a semiconductor optical device comprising a substrate; a semiconductor electrode layer of a first conductive type formed on the substrate and having a groove formed to a desired depth therein; a semiconductor layer of the first conductive type formed from side walls of the groove up to a part of the semiconductor electrode layer of the first conductive type on the periphery of the groove; a cladding layer of the first conductive type, an active layer of the first conductive type, a cladding layer of a second conductive type and a semiconductor electrode layer of the second conductive type sequentially formed on the semiconductor layer of the first conductive type; and electrodes of the first and second conductive types formed respectively on the semiconductor electrode layers of the first and second conductive types.

In accordance with another aspect of the present invention, there is provided a method for fabricating a semiconductor optical device, comprising the steps of sequentially forming a semiconductor electrode layer of a first conductive type and a first silicon oxide film on a substrate; patterning a desired region of the first silicon oxide film into a desired shape to partially expose the semiconductor electrode layer of the first conductive type and etching the resultant exposed region of the semiconductor electrode layer of the first conductive type to a desired depth to form a groove; forming a second silicon oxide film on a bottom of the groove; growing a semiconductor layer of the first conductive type from side walls of the groove up to a part of the first silicon oxide film on the periphery of the groove; sequentially growing a cladding layer of the first conductive type, an active layer of the first conductive type, a cladding layer of a second conductive type and a semiconductor electrode layer of the second conductive type on the semiconductor layer of the first conductive type to form an optical cavity mirror; and forming electrodes of the first and second conductive types respectively on the semiconductor electrode layers of the first and second conductive types.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

The concept of the present invention is to naturally form an optical cavity mirror by growing a semiconductor laser diode film structure using an epitaxial lateral overgrowth (ELOG) method.

Therefore, the present invention is able to exclude a conventional dry etching or cleaving process for the formation of an optical cavity mirror as in the prior art, so that it can simplify a fabricating process of the device and improve the optical efficiency and reliability of the device.

Figure 1:
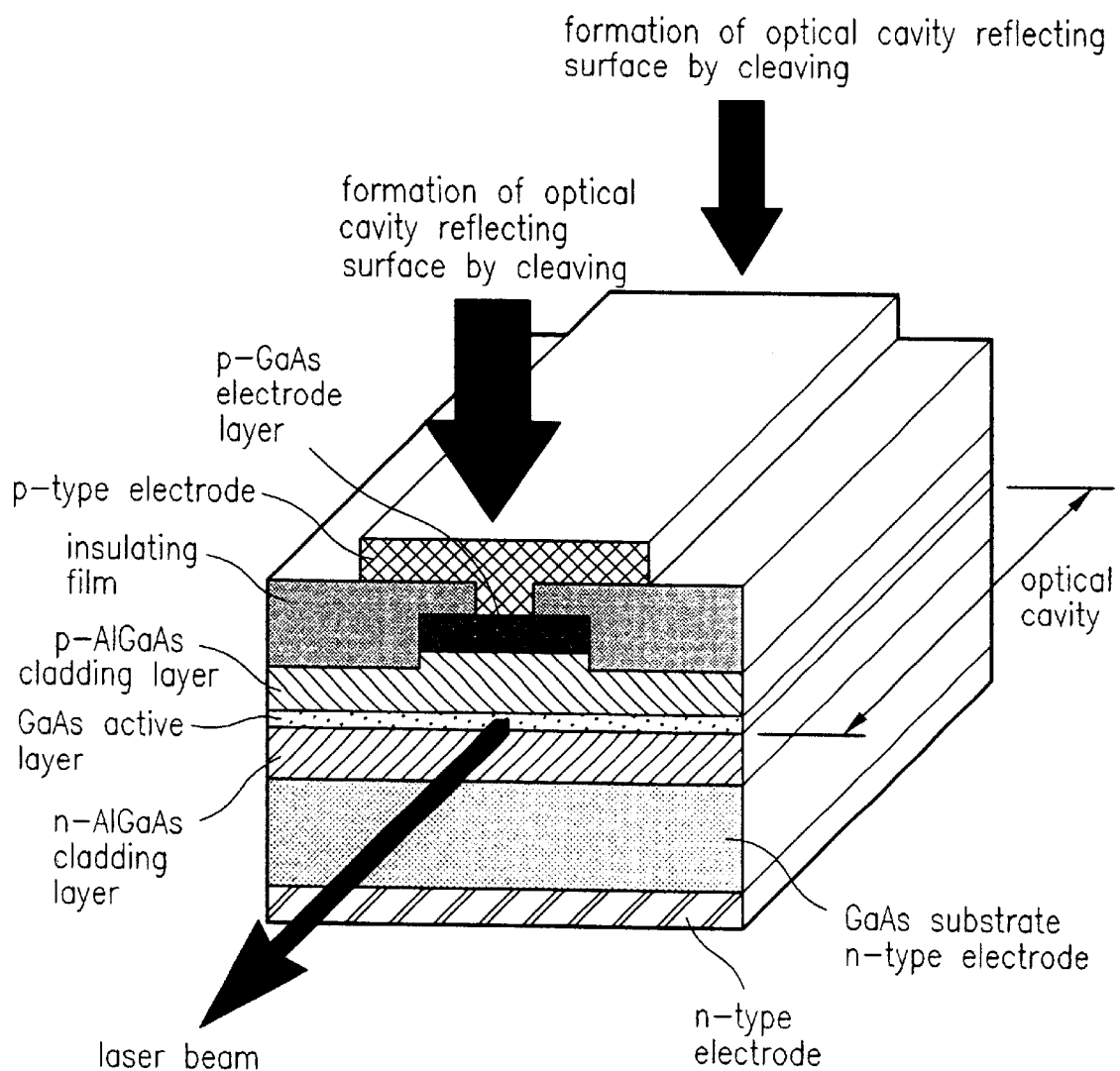
FIG. 1 is a perspective view showing a structure of a conventional GaAs semiconductor laser diode employing an optical cavity mirror formed by a cleaving process.
Figure 2:
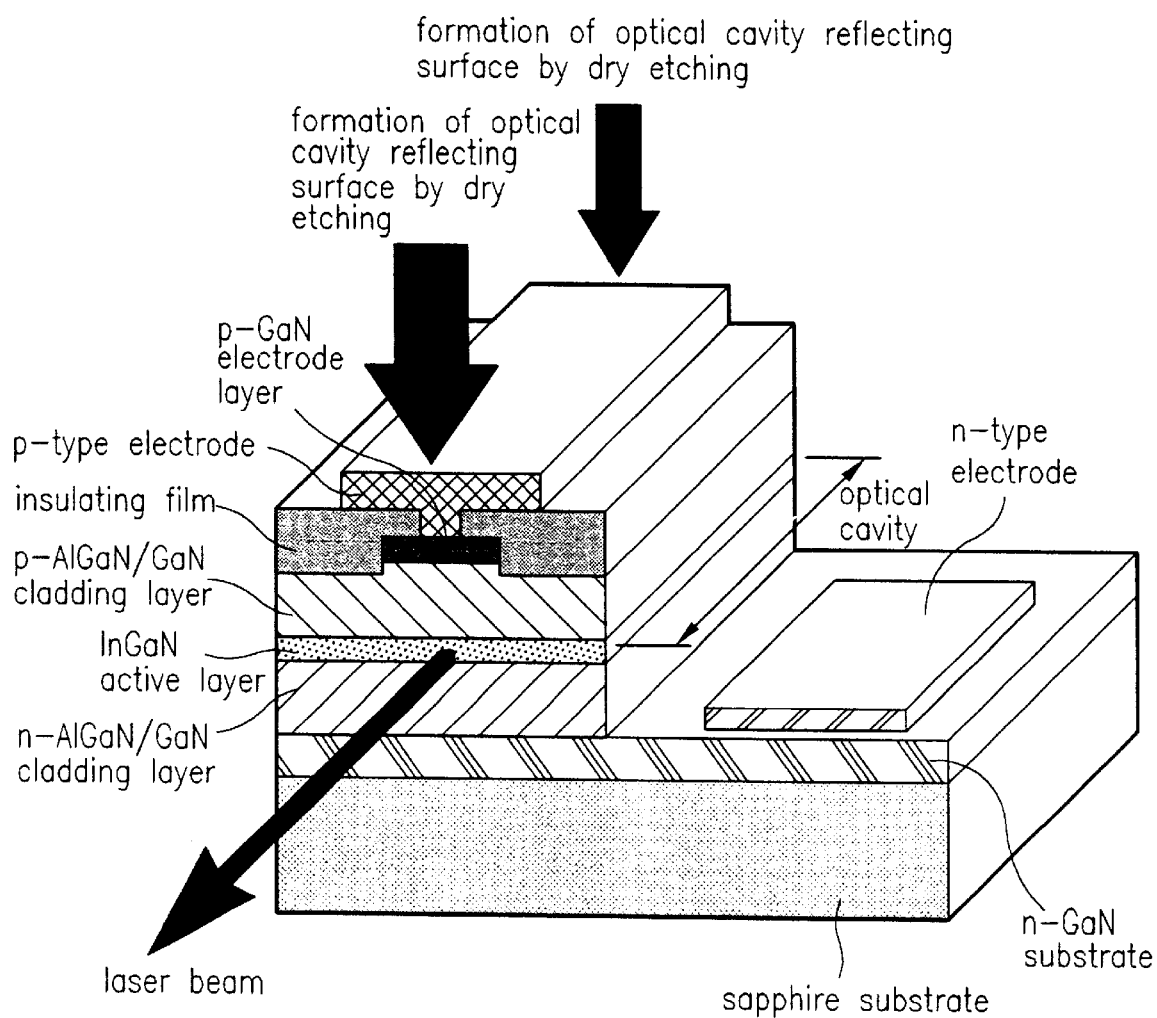
FIG. 2 is a perspective view showing a structure of a conventional GaN semiconductor laser diode employing an optical cavity mirror formed by a dry etching process.
Figure 3:
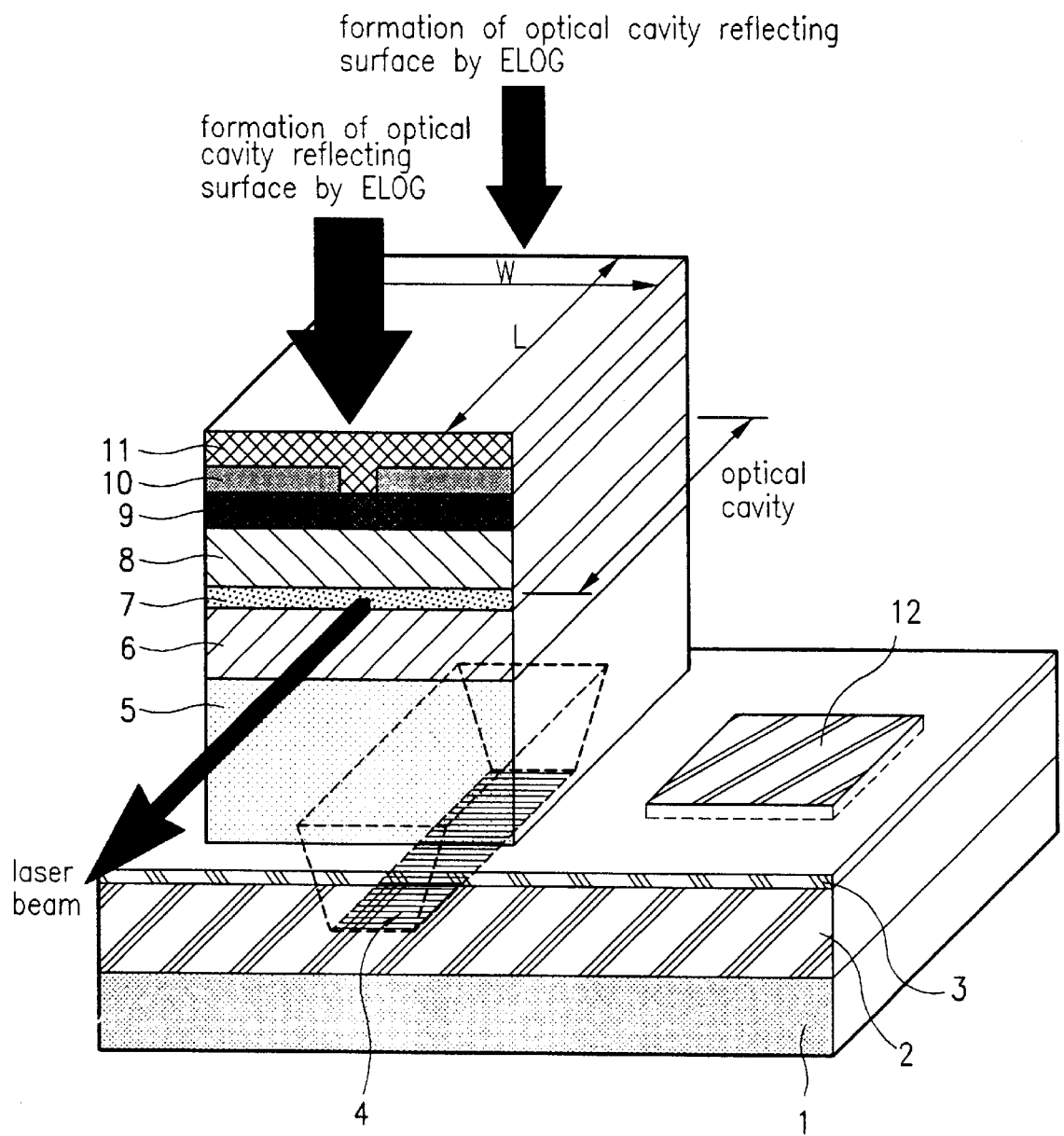
FIG. 3 is a perspective view showing a structure of a GaN semiconductor laser diode in accordance with the present invention.

FIG. 3 is a perspective view showing a structure of a GaN semiconductor laser diode in accordance with the present invention. According to the present invention, the structure of the GaN semiconductor laser diode is characterized in that a groove is formed in an n-type GaN electrode layer 2 to have a desired pattern and GaN is laterally grown from side walls of the groove on the basis of the ELOG method to form an n-type ELOG GaN layer 5.

The formation of the n-type ELOG GaN layer 5 leads to the natural formation of an optical cavity mirror, as shown in FIG. 3.

Namely, according to the present invention, the optical cavity mirror is naturally formed during the growth of a device film, so that it does not have a physical and chemical shock which is applied to a conventional optical cavity mirror formed by the dry etching process, thereby increasing the efficiency and reliability of the laser diode. Further, a separate etching process for the formation of an n-type electrode is also omitted, resulting in a simplification in the entire fabricating process.

Further, a leakage current which is induced in the device surface due to the dry etching is reduced in amount, resulting in an increase in the device efficiency.

Now, the structural characteristics of the GaN semiconductor laser diode will be mentioned in more detail with reference to a fabricating process of the present invention.

Figure 4A:
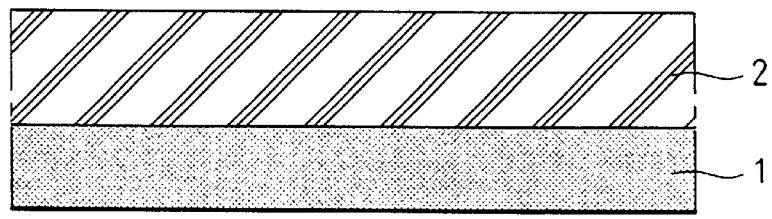
FIGS. 4A to 4G are cross-sectional views illustrating a process of fabricating the GaN semiconductor laser diode in accordance with the present invention.

FIGS. 4A to 4G are cross-sectional views illustrating a process of fabricating the GaN semiconductor laser diode in accordance with the present invention. As shown in FIG. 4A, the n-type GaN electrode layer 2 is first grown on a (0001) sapphire substrate 1 which was subjected to an organic solvent/acid cleaning process.

The n-type GaN electrode layer 2 may be grown by any one of a metal organic chemical vapor deposition (MOCVD) method, molecular beam epitaxy method and hydride vapor phase epitaxy method. In the preferred embodiment of the present invention, the MOCVD method is used as an example for the growth of the n-type GaN electrode layer 2.

Although the thickness of the n-type GaN electrode layer 2 is changeable according to a manufacturer's selection, it is preferably in a range of 1~100$\mu$m, and more preferably in a range of 2~20$\mu$m.

On the other hand, a buffer layer may be grown prior to the growth of the n-type GaN electrode layer 2 to raise a film quality of the electrode layer 2.

Here, GaN or AlN may be used for the buffer layer and a growth temperature for the buffer layer may be in a range of 500~1100° C.

A growth temperature for the n-type GaN electrode layer 2 is in a range of 750~1200° C.

Figure 4B:
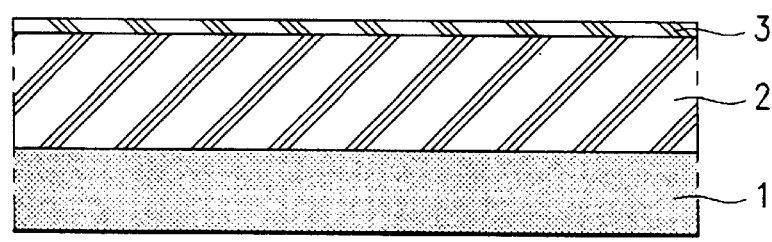

Thereafter, as shown in FIG. 4B, a first silicon oxide film 3 is formed on the n-type GaN electrode layer 2.

The first silicon oxide film 3 preferably has a thickness in a range of 0.05~0.5$\mu$m, and more preferably in a range of 0.08~0.2$\mu$m.

Here, the first silicon oxide film 3 may be formed by any one of a plasma enhanced chemical vapor epitaxy method, chemical vapor epitaxy method and electron beam evaporation method.

Figure 4C:
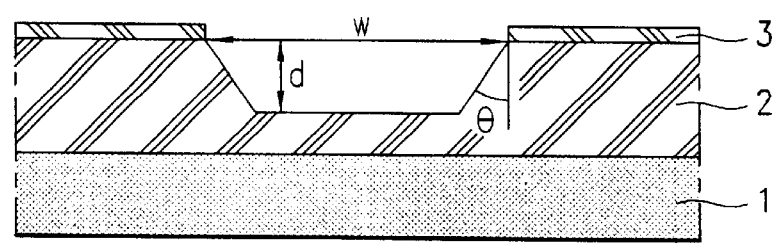

Subsequently, as shown in FIG. 4C, a rectangular pattern with a desired dimension is formed on the first silicon oxide film 3 by a photolithography process and the n-type GaN electrode layer 2 is removed to a desired depth by a dry or wet etching process to form a groove.

The formed groove has an inverted trapezoidal cross-section where the top is large in width, the bottom is small in width and each of the side walls is inclined at a desired angle.

The depth d of the groove is in a range of 10~80% of the thickness of the n-type GaN electrode layer 2 and the inclination angle e of each of the side walls of the groove is in a range of 0~60 degrees.

Together with the growth temperatures, the inclination angle of each side wall of the groove is an important factor for the provision of a GaN surface which serves as a source of ELOG.

Figure 5:
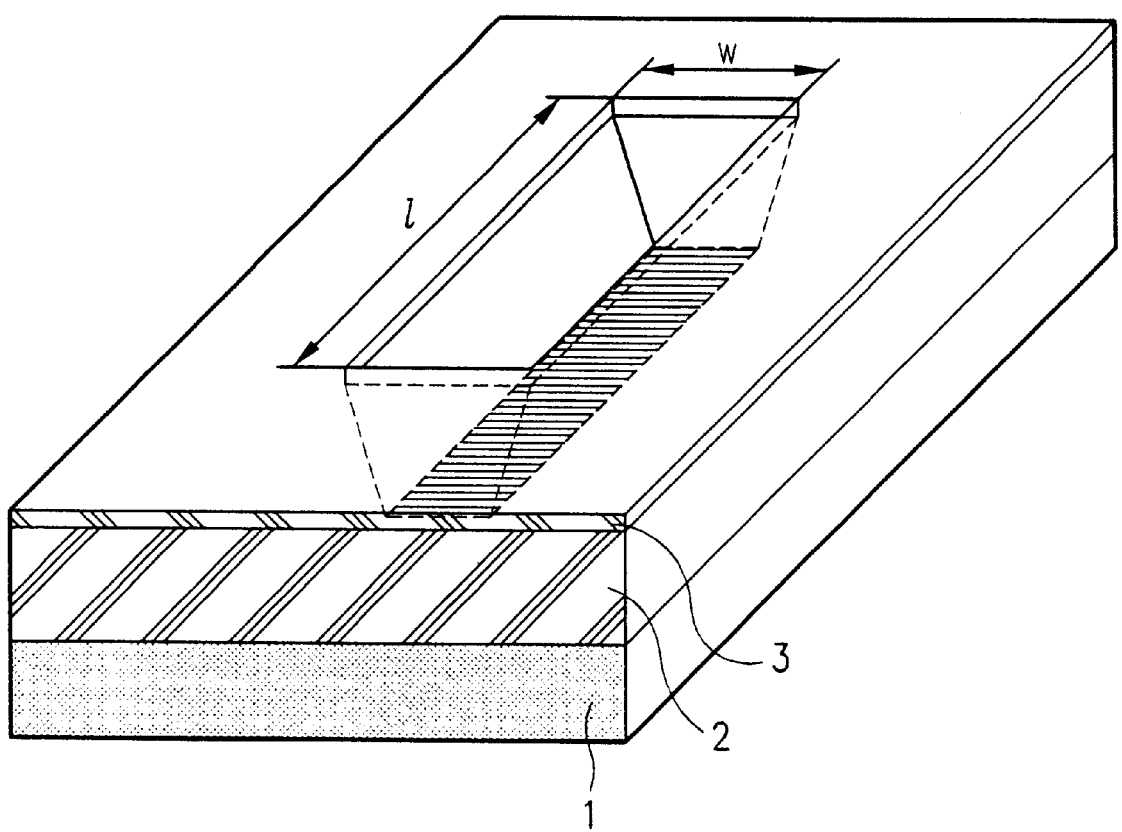
FIG. 5 is a perspective view showing an ELOG pattern for the growth of GaN in accordance with the present invention.

As shown in FIG. 5, the rectangular pattern of the first silicon oxide film 3 has a length 1 in a range of 100~2000$\mu$m and a width w in a range of 1~100$\mu$m.

The rectangular pattern of the first silicon oxide film 3 further has a longitudinal orientation crossing a (1120) or (1100) orientation of the substrate 1 at an angle of 30 degrees and a dimension determined depending on a size of the semiconductor laser diode.

Figure 4D:
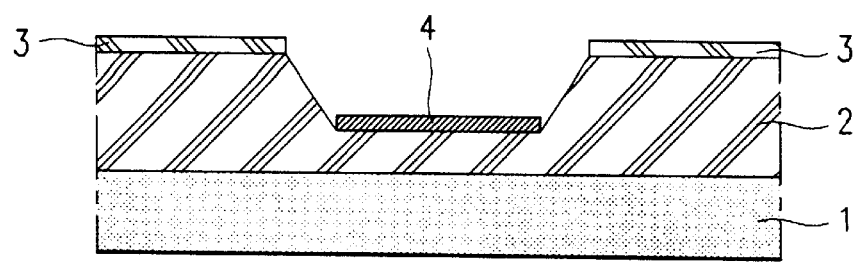

Thereafter, as shown in FIG. 4D, a second silicon oxide film 4 is formed on the bottom of the groove in such a way that it does not cover the ELOG source.

The second silicon oxide film 4 preferably has a thickness in a range of 0.05~0.5$\mu$m, and more preferably in a range of 0.08~0.2$\mu$m.

Figure 4E:
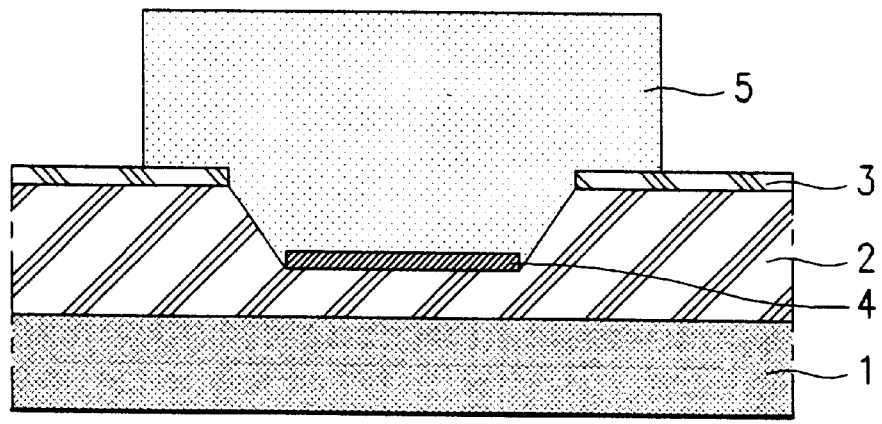

Subsequently, as shown in FIG. 4E, an n-type ELOG GaN layer 5 is grown from the side walls of the groove up to a part of the n-type GaN electrode layer 2 on the periphery of the groove.

In the initial growth based on the ELOG method, the n-type ELOG GaN layer 5 is only laterally grown from the n-type GaN electrode layer 2 as the ELOG source.

The n-type ELOG GaN layer 5 covers the surface of the second silicon oxide film 4 through the lateral growth and is then continuously grown until its surface becomes higher than that of the first silicon oxide film 3.

At this time, the substrate temperature is in a range of 950~1150° C. during the growth of the n-type ELOG GaN layer 5.

Figure 4F:
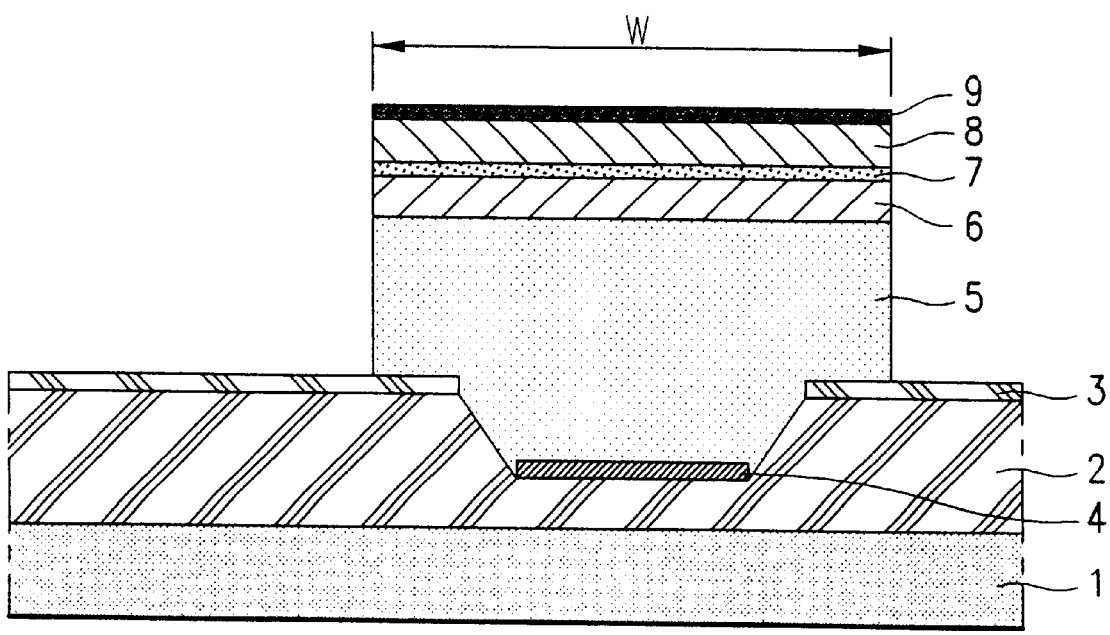

Thereafter, as shown in FIG. 4F, an n-type AlGaN/GaN cladding layer 6, GaN/InGaN active layer 7, p-type AlGaN/GaN cladding layer 8 and p-type GaN electrode layer 9 are sequentially formed on the n-type ELOG GaN layer 5, resulting in the formation of an optical cavity mirror.

In the case where the device film is grown according to the ELOG method, as shown in FIG. 3, a reflecting surface of the optical cavity mirror has a width w in a range of 3~500$\mu$m and a length L in a range of 100~3000$\mu$m.

Figure 4G:
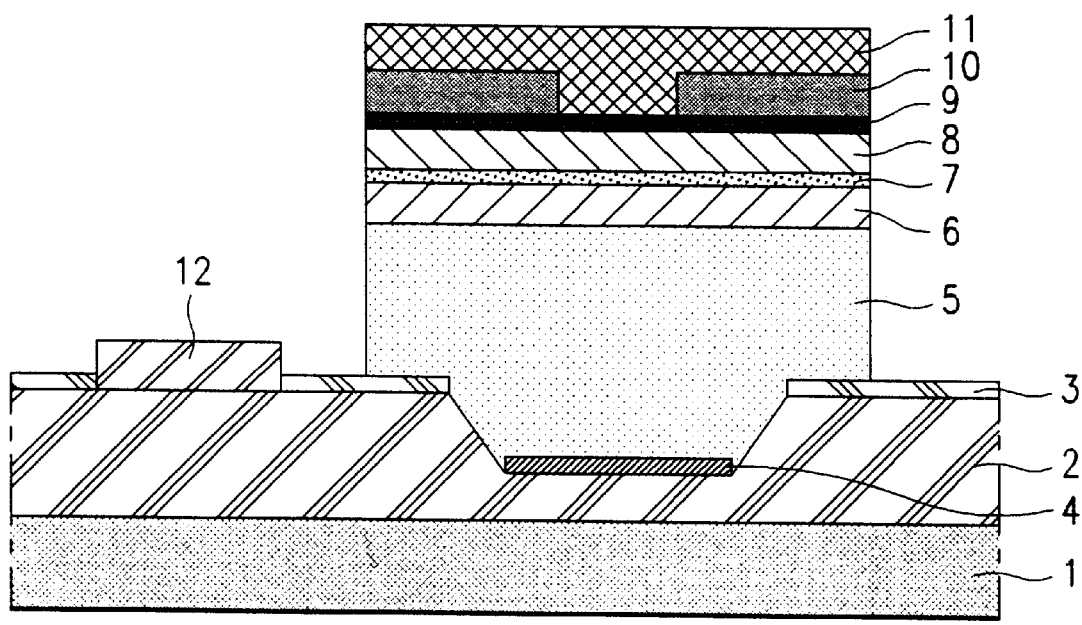

Subsequently, a dry or wet etching process is performed to remove residues on side walls of the optical cavity mirror. An insulating film 10 and p-type electrode 11 are sequentially formed on the p-type GaN electrode layer 9, as shown in FIG. 4G. The first silicon oxide film 3 is partially removed by a dry or wet etching process to expose a desired region of the n-type GaN electrode layer 2. An n-type electrode 12 is formed on the exposed region of the n-type GaN electrode layer 2.

Alternatively, the n-type electrode 12 and p-type electrode 11 may be formed in the opposite order to that mentioned above and hole activation of the p-type AlGaN/GaN cladding layer 8 may be made before or after the formation of the p-type electrode 11.

As stated above, according to the present invention, the optical cavity mirror can naturally be formed on the basis of the ELOG characteristic, with no necessity for forming a separate ridge.

Figure 6A:
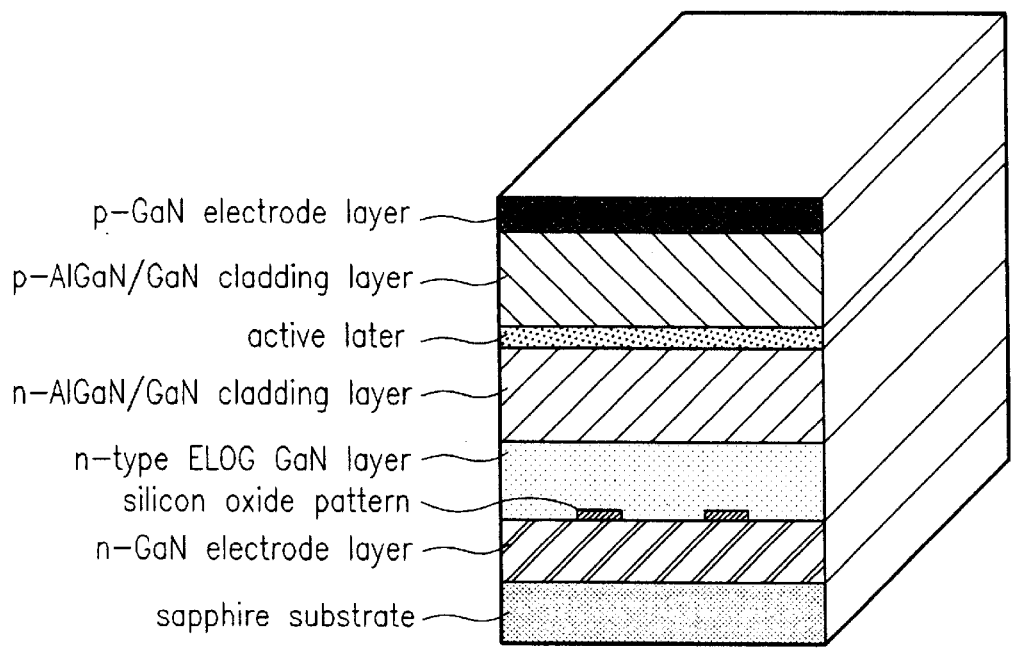
FIG. 6A is a perspective view showing a device film structure grown according to a conventional ELOG method.

FIG. 6A is a perspective view showing a device film structure grown according to a conventional ELOG method. When a device film has been grown according to the conventional ELOG method as shown in FIG. 6A, it has a flat surface, which must ,be subjected to several etching processes for the formation of a mesa structure, ridge structure and optical cavity mirror for discrete devices.

Figure 6B:
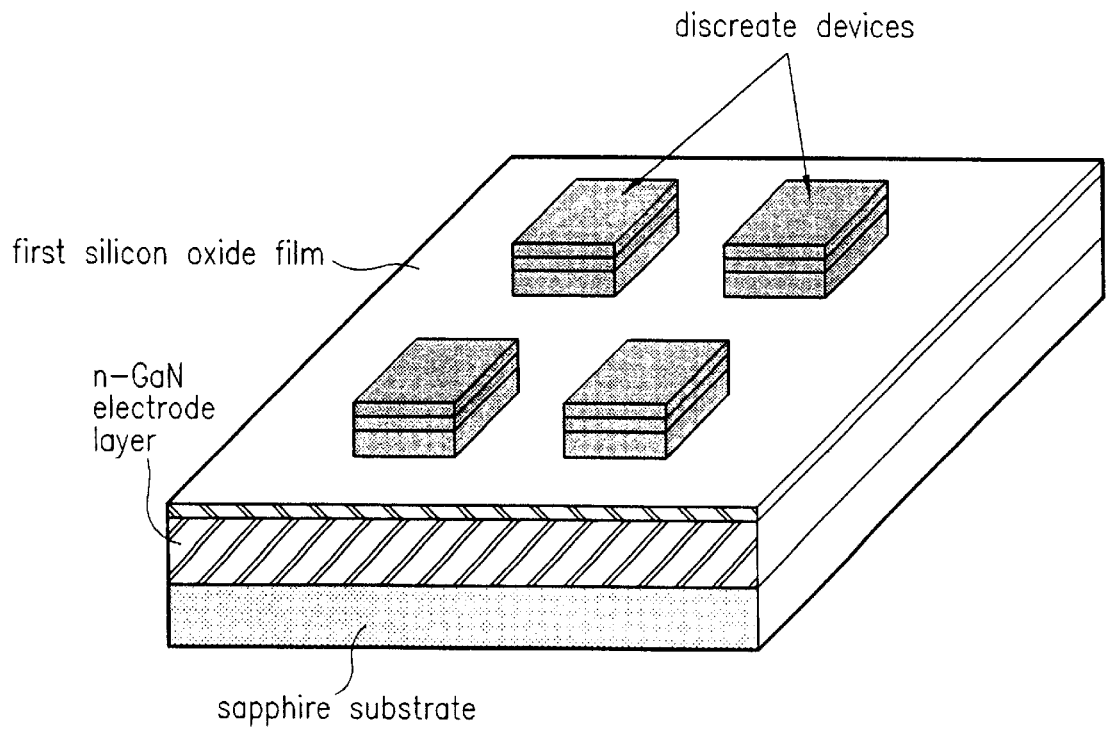
FIG. 6B is a perspective view showing an embodiment of a device film structure grown according to the present invention.

However, according to the present invention, the formation of the mesa structure, ridge structure and optical cavity mirror is completed at the same time that the growth of the device film is completed, as shown in FIG. 6B.

In FIG. 6B, a plurality of grooves are formed on a substrate in the form of dots and devices are formed correspondingly respectively to the formed grooves. Alternatively, as shown in FIG. 7, a plurality of grooves may be formed on a substrate in the form of stripes and a plurality of devices may be formed correspondingly to each of the formed grooves.

Figure 7:
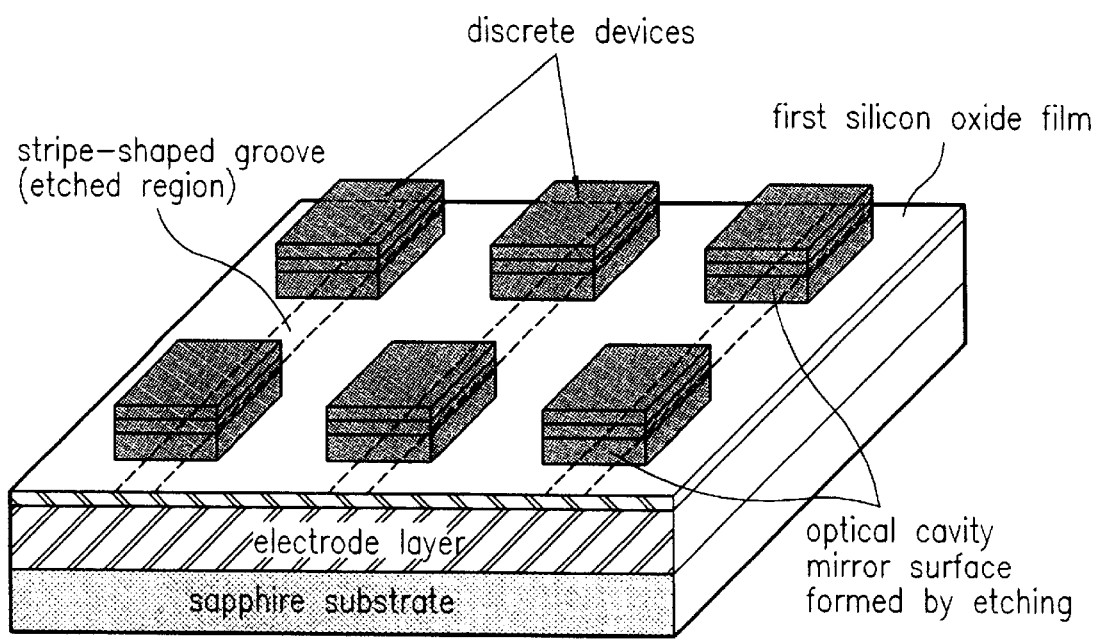
FIG. 7 is a perspective view showing an alternative embodiment of the device film structure grown according to the present invention.

In other words, the grooves in FIG. 6B are formed in an n-type GaN electrode layer in the form of discrete dots and the grooves in FIG. 7 are formed in the n-type GaN electrode layer in the form of stripes elongating longitudinally (i.e., the 1 direction in FIG. 5).

The fabrication of each device is completed by forming the optical cavity mirror over the stripe-shaped groove through the same processes as stated previously.

The present invention is applicable even to the fabrication of any other electronic devices than the semiconductor laser diode, such as a light emitting diode, thin film transistor, etc.

As apparent from the above description, according to the present invention, the GaN semiconductor optical device and the method for fabricating the same have the following advantages.

Firstly, the optical cavity mirror which is the most important factor for the semiconductor laser diode operation is naturally formed during the growth of the semiconductor laser diode film, thereby making it possible to omit a dry etching process and the associated photolithography process and accompanying processes, conventionally used for the formation of the optical cavity mirror, resulting in a simplification in the entire fabricating process and an increase in the production efficiency.

Secondly, a dry etching process conventionally used for the formation of the optical cavity mirror and ridge is omitted. Therefore, the optical cavity mirror does not have a physical and chemical shock which is applied to a conventional optical cavity mirror formed by the dry etching process, thereby improving the reliability and optical efficiency of the device.

Thirdly, the semiconductor laser diode film is grown according to the ELOG method in such a manner that it can have a threading dislocation density of near zero. This improves the reliability of the device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor optical device, comprising the steps of:
   (a) sequentially forming a semiconductor electrode layer of a first conductive type and a first silicon oxide film on a substrate;
   (b) patterning a desired region of said first silicon oxide film into a desired shape to partially expose said semiconductor electrode layer of said first conductive type and etching the resultant exposed region of said semiconductor electrode layer of said first conductive type to a desired depth to form a groove;
   (c) forming a second silicon oxide film on a bottom of said groove;
   (d) growing a semiconductor layer of said first conductive type from side walls of said groove up to a part of said first silicon oxide film on the periphery of said groove;
   (e) sequentially growing a cladding layer of said first conductive type, an active layer of said first conductive type, a cladding layer of a second conductive type and a semiconductor electrode layer of said second conductive type on said semiconductor layer of said first conductive type to form an optical cavity mirror; and
   (f) forming electrodes of said first and second conductive types respectively on said semiconductor electrode layers of said first and second conductive types.

2. A method for fabricating a semiconductor optical device, as set forth in claim 1, wherein said first and second silicon oxide films are formed by any one of a plasma enhanced chemical vapor epitaxy method, a chemical vapor epitaxy method and an electron beam evaporation method.

3. A method for fabricating a semiconductor optical device, as set forth in claim 1, wherein said semiconductor layer of said first conductive type or the subsequent layers are grown by an epitaxial lateral overgrowth method.

4. A method for fabricating a semiconductor optical device, as set forth in claim 1, wherein said semiconductor layer of said first conductive type is grown at a substrate temperature in a range of 950~1150° C.

5. A method for fabricating a semiconductor optical device, as set forth in claim 1, wherein said step (f) includes the step of partially removing said first silicon oxide film using a dry or wet etching process to expose a desired region of said semiconductor electrode layer of said first conductive type and forming said electrode of said first conductive type on the exposed region of said semiconductor electrode layer of said first conductive type.

6. A method for fabricating a semiconductor optical device, as set forth in claim 1, further comprising the step of removing residues on side walls of said optical cavity mirror after said step (e) is performed.

\* \* \* \* \*